United States Patent
Wang et al.

(10) Patent No.: US 12,378,667 B2
(45) Date of Patent: Aug. 5, 2025

(54) METHODS AND SYSTEMS FOR FORMING DOPED SILICON NITRIDE FILMS

(71) Applicant: ASM IP Holding B.V., Almere (NL)

(72) Inventors: Xingye Wang, Gilbert, AZ (US); Fu Tang, Gilbert, AZ (US); Eric Jen cheng Liu, Tempe, AZ (US); Peijun Jerry Chen, Phoenix, AZ (US); YoungChol Byun, Tempe, AZ (US)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 17/971,860

(22) Filed: Oct. 24, 2022

(65) Prior Publication Data

US 2023/0126516 A1    Apr. 27, 2023

Related U.S. Application Data

(60) Provisional application No. 63/272,486, filed on Oct. 27, 2021.

(51) Int. Cl.
*C23C 16/455*    (2006.01)
*C23C 16/34*    (2006.01)
*H01L 21/02*    (2006.01)

(52) U.S. Cl.
CPC ...... *C23C 16/45553* (2013.01); *C23C 16/345* (2013.01); *C23C 16/45527* (2013.01); *H01L 21/0217* (2013.01); *H01L 21/02211* (2013.01); *H01L 21/0228* (2013.01); *H01L 21/02312* (2013.01); *H01L 21/02491* (2013.01)

(58) Field of Classification Search
CPC ............ C23C 16/45553; C23C 16/345; C23C 16/45527; H01L 21/0217; H01L 21/02211; H01L 21/0228; H01L 21/02312; H01L 21/0249

See application file for complete search history.

(56) References Cited

U.S. PATENT DOCUMENTS

| | | | |
|---|---|---|---|
| 6,534,395 B2 | 3/2003 | Werkhoven | |
| 7,981,791 B2 | 7/2011 | Haukka | |
| 9,786,570 B2 | 10/2017 | Kang | |
| 10,770,286 B2 | 9/2020 | Woodruff | |
| 10,892,156 B2 | 1/2021 | Woodruff | |
| 2002/0016084 A1* | 2/2002 | Todd | H01L 21/02219 438/791 |
| 2005/0020042 A1* | 1/2005 | Heo | H01L 29/4966 438/587 |
| 2006/0286776 A1* | 12/2006 | Ranish | H01L 21/31612 257/E21.267 |
| 2010/0022069 A1* | 1/2010 | Nakamori | H01L 21/76232 257/E21.546 |
| 2015/0099375 A1* | 4/2015 | Haripin | H01L 21/0217 438/793 |

FOREIGN PATENT DOCUMENTS

WO    WO-2008073750 A2 *    6/2008    ............. C23C 16/22

* cited by examiner

*Primary Examiner* — Michael G Miller
(74) *Attorney, Agent, or Firm* — Snell & Wilmer L.L.P.

(57) ABSTRACT

A method of forming a doped silicon nitride film on a surface of a substrate and structures including the doped silicon nitride film are disclosed. Exemplary methods include forming a layer comprising silicon nitride using a first thermal process and forming a layer comprising doped silicon nitride using a second thermal process to thereby form the doped silicon nitride film.

21 Claims, 5 Drawing Sheets

METHODS AND SYSTEMS FOR FORMING DOPED SILICON NITRIDE FILMS

CROSS-REFERENCE TO RELATED APPLICATIONS

This application is a nonprovisional of, and claims priority to and the benefit of, U.S. Provisional Patent Application No. 63/272,486, filed Oct. 27, 2021 and entitled "METHODS AND SYSTEMS FOR FORMING DOPED SILICON NITRIDE FILMS," which is hereby incorporated by reference herein.

FIELD OF INVENTION

The present disclosure generally relates to methods and systems for depositing material on a surface of a substrate.

BACKGROUND OF THE DISCLOSURE

During the formation of devices, such as semiconductor devices, it is often desirable to form patterned features on a surface of a substrate. Typically, to form patterned features, a layer of material is deposited, the deposited layer is then patterned using, for example, photolithography techniques, and then portions of the layer are etched to form the patterned features including the material.

Doped silicon nitride layers have a variety of desirable properties suitable for semiconductor devices. For example, doped silicon nitride layers can exhibit desired etch resistance to etchants used to etch other materials, such as silicon oxide and silicon nitride. Further, a dielectric constant of doped silicon nitride layers can be desirably low—e.g., lower than, for example, a dielectric constant silicon nitride.

For many applications, it may be desirable to conformally deposit quality doped silicon nitride layers over features on a surface of a substrate at relatively low (e.g., less than 650° C.) temperatures. Plasma-enhanced chemical vapor deposition (PECVD) can be used to deposit doped silicon nitride layers overlying features at relatively low temperatures. However, doped silicon nitride layers deposited using plasma-enhanced processes may not be conformally deposited and/or properties of the doped silicon nitride layers may not be conformal across the features-particularly for relatively high aspect ratio features (e.g., feature having an aspect ratio of 3 or more). Further, use of a plasma during deposition can damage the deposited layer or an underlying layer. In contrast, thermal deposition techniques can be used to conformally deposit quality doped silicon nitride layers. However, relatively high, and in many cases, undesirably high, temperatures are generally used for such processes. Additionally or alternatively, thermal deposition processes for doped silicon nitride films may not provide desired dopant concentrations and/or control of dopant concentrations within in the film. Improved methods of depositing doped silicon nitride layers are therefore desired.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY OF THE DISCLOSURE

Various embodiments of the present disclosure relate to methods of forming doped silicon nitride films on a surface of a substrate, to structures including the films, and to systems for forming the films. While the ways in which various embodiments of the present disclosure address drawbacks of prior methods and structures are discussed in more detail below, in general, embodiments of the disclosure provide improved methods for forming doped silicon nitride films, which allow compositional tuning of the films, and which, in at least some cases, allow formation of the films at relatively low temperatures and without use of a plasma.

In accordance with exemplary embodiments of the disclosure, a method of forming a doped silicon nitride film on a surface of a substrate includes: using a first thermal cyclic deposition process, forming a layer comprising silicon nitride, and using a second thermal cyclic deposition process, forming a layer comprising doped silicon nitride. The layer comprising silicon nitride and the layer comprising doped silicon nitride together form the doped silicon nitride film. Exemplary doped silicon nitride films can include, for example, carbon and/or boron. In accordance with examples of these embodiments, the first thermal cyclic deposition process comprises providing a first precursor and optionally a first reactant to the reaction chamber, the second thermal cyclic deposition process comprises providing a second precursor and optionally a second reactant to the reaction chamber, and one or more of the first precursor differs from the second precursor and the first reactant differs from the second reactant. In accordance with examples of these embodiments, the first precursor comprises a halogenated precursor—e.g., a halogenated silane compound, such as a compound represented by $H_{2n+2-y}Si_nX_y$, wherein each X is an independently selected halogen, wherein n is between 1 and 5, and wherein y is 1 or more and up to 2n+2. In some cases, the first precursor differs from the second precursor. In some cases, the first reactant and the second reactant comprises the same compound. The first and/or second reactant can include a compound comprising nitrogen. For example, the first and/or second reactant can be selected from one or more of $H_2$ and $N_2$, $NH_3$, $N_2H_4$, or an alkyl hydrazine represented by the following formula, where each of R1-R4 can be independently selected from a C1-C4 alkyl group or H.

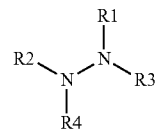

In some cases, the second reactant can include a dopant (e.g., carbon or boron). For example, the second reactant can include a methylamine group, which can serve as a (carbon) dopant source. Exemplary methylamine precursors include trimethylamine $(CH_3)_3N$, methylamine $(CH_3NH_2)$, and the like. In some cases, the first and/or second reactant can include boron; exemplary reactants that include boron include boron halogen compounds, such as $BCl_3$.

Exemplary methods can further include a step of pretreating a surface of the substrate. The step of pretreating can include forming activated species from a nitrogen-containing gas. In accordance with further examples of the disclosure, a temperature within the reaction chamber during one or more steps of the method is less than 650° C. or less than 500° C. or less than 450° C. In some cases, the temperature can be higher—e.g., between about 550° C. and 850° C. or about 580° C. and 750° C. In accordance with further examples, multiple steps (e.g., all of the steps) of a method can be performed within the same reactor—e.g., within the same reaction chamber of a reactor. In accordance with further examples, a concertation of a dopant (e.g., boron and/or carbon) in the doped silicon nitride film can between 0 or greater than 0 and 54 at % or greater than 0 to 30 at %. A concentration of the dopant can be manipulated by, for example, manipulating or adjusting a number of cycles of the first thermal cyclic deposition process relative to a number of cycles of the second thermal cyclic deposition process.

In accordance with additional embodiments of the disclosure, a structure includes a doped silicon nitride film, such as a doped silicon nitride film formed according to a method described herein. The doped silicon nitride film can be or include silicon carbon nitride or silicon boron nitride.

In accordance with further examples of the disclosure, a system is provided. The system can be configured to perform a method as described herein and/or to form a structure as described herein.

These and other embodiments will become readily apparent to those skilled in the art from the following detailed description of certain embodiments having reference to the attached figures; the invention not necessarily being limited to any particular embodiment(s) disclosed.

BRIEF DESCRIPTION OF THE DRAWING FIGURES

A more complete understanding of exemplary embodiments of the present disclosure can be derived by referring to the detailed description and claims when considered in connection with the following illustrative figures.

Figure 1:
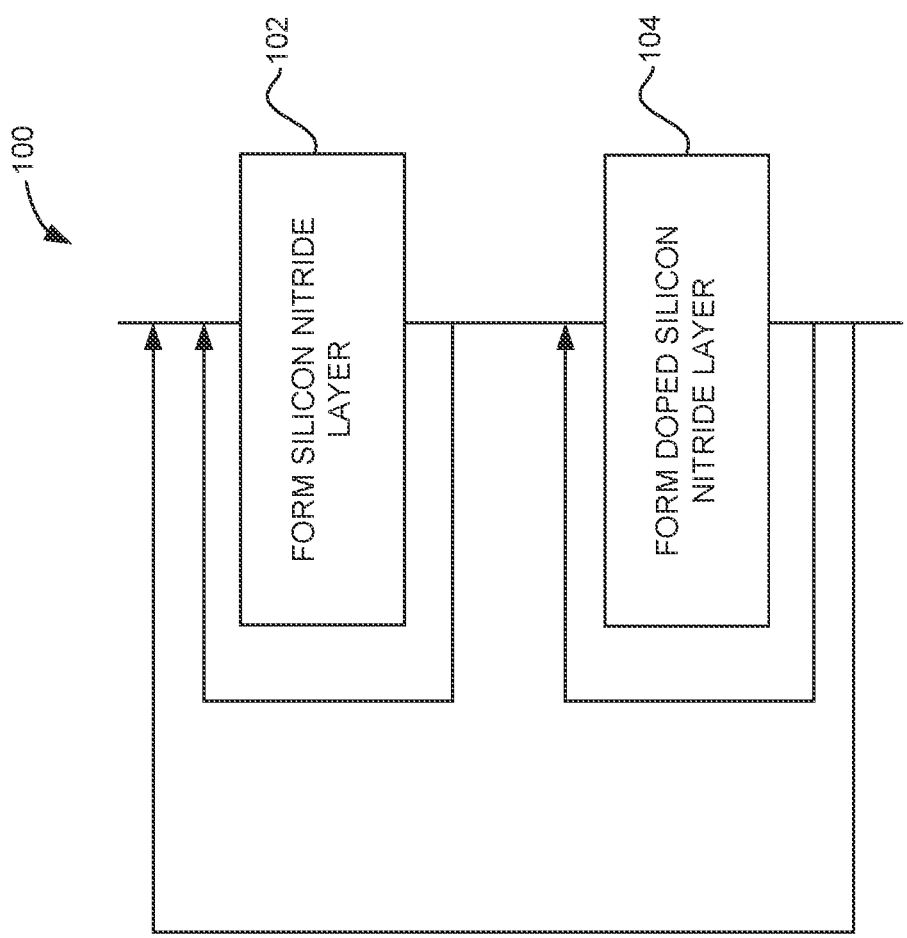
FIG. 1 illustrates method of forming a doped silicon nitride film in accordance with at least one embodiment of the disclosure.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

The present disclosure generally relates to methods of forming doped silicon nitride films, structures formed using the methods, and systems that can be used to perform the methods and/or form the structures. As described in more detail below, exemplary methods can be used to form doped silicon nitride films suitable for a variety of applications, such as etch stop layers, (e.g., low k) dielectric layers, and the like. Further, as described below, exemplary methods employ thermal cyclic deposition processes. Exemplary methods can be used to form conformal doped silicon nitride films with desired properties. Additionally or alternatively, exemplary methods can be used to tune or adjust an amount of dopant in thermally-deposited doped silicon nitride films.

In some embodiments, a conformal layer exhibits a step coverage equal to or greater than 50%, or greater than 80%, or greater than 90%, or greater than 100%, or greater than 110%, or greater than 150%, or greater than 200%, in/on structures having aspect ratios (height/width) of more than about 2, more than about 5, more than about 10, more than about 25, more than about 50, more than about 100, or between about 10 and 100 or about 5 and about 25. It shall be understood that the term step coverage refers to a thickness of a layer on a top surface of a feature, divided by the thickness of that layer on a bottom surface of the feature, and is expressed as a percentage.

In this disclosure, gas may include material that is a gas at normal temperature and pressure, a vaporized solid and/or a vaporized liquid, and may be constituted by a single gas or a mixture of gases, depending on the context. A gas other than the process gas, e.g., a gas introduced without passing through a gas distribution assembly, such as a showerhead, other gas distribution device, or the like, may be used for, e.g., sealing the reaction space, and may include a seal gas, such as a rare or other inert gas. The term inert gas refers to a gas that does not take part in a chemical reaction to an appreciable extent. In some cases, the terms precursor and reactant can be used interchangeably.

As used herein, the term substrate can refer to any underlying material or materials that may be used to form, or upon which, a device, a circuit, or a film may be formed. A substrate can include a bulk material, such as silicon (e.g., single-crystal silicon), other Group IV materials, such as germanium, or compound semiconductor materials, such as GaAs, and can include one or more layers overlying or underlying the bulk material. Further, the substrate can include various structures, such as recesses, vias, lines, and the like formed within or on at least a portion of a layer of the substrate.

As used herein, the term cyclic or cyclical deposition may refer to the sequential introduction of precursors/reactants into a reaction chamber to deposit a layer over a substrate and includes processing techniques such as atomic layer deposition and cyclical chemical vapor deposition.

As used herein, the term atomic layer deposition (ALD) may refer to a vapor deposition process in which deposition cycles, typically a plurality of consecutive deposition cycles, are conducted in a process chamber. Generally, during each cycle, a precursor is chemisorbed to a deposition surface (e.g., a substrate surface that can include a previously deposited material from a previous ALD cycle or other material), forming about a monolayer or sub-monolayer of material that does not readily react with additional precursor (i.e., a self-limiting reaction). Thereafter, in some cases, a reactant may subsequently be introduced into the process chamber for use in converting the chemisorbed precursor to the desired material on the deposition surface. The reactant can be capable of further reaction with the precursor. Further, purging steps can also be utilized during and/or between cycles to remove excess precursor from the process chamber and/or remove excess reactant and/or reaction byproducts from the process chamber. The term atomic layer deposition, as used herein, is also meant to include processes designated by related terms, such as chemical vapor atomic layer deposition, atomic layer epitaxy (ALE), molecular beam epitaxy (MBE), gas source MBE, or organometallic MBE, and chemical beam epitaxy when performed with alternating pulses of precursor(s)/reactive gas(es), and purge (e.g., inert) gas(es).

As used herein, the term cyclical chemical vapor deposition may refer to any process wherein a substrate is sequentially exposed to two or more volatile precursors, which react and/or decompose on a substrate to produce a desired deposition.

In some embodiments, film refers to one or more layers extending in a direction perpendicular to a thickness direction to cover an entire target or concerned surface, or simply a layer covering a target or concerned surface. In some embodiments, layer refers to a structure having a certain thickness formed on a surface or a synonym of film or a non-film structure. A layer can be continuous or noncontinuous. A film or layer may be constituted by a discrete single film or layer having certain characteristics or multiple films or layers, and a boundary between adjacent films or layers may or may not be clear and may or may not be established based on physical, chemical, and/or any other characteristics, formation processes or sequences, and/or functions or purposes of the adjacent films or layers. In some cases, the terms film and layer can be used interchangeably. In some cases, a film includes one or more layers.

In this disclosure, continuously can refer to one or more of without breaking a vacuum, without interruption as a timeline, without any material intervening step, without changing conditions, immediately thereafter, as a next step, or without an intervening discrete physical or chemical structure or layer between two structures or layers in some embodiments. For example, a reactant and/or an inert gas can be supplied continuously during two or more steps and/or deposition cycles of a method.

As used herein, the term purge may refer to a procedure in which an inert or substantially inert gas (i.e., a gas that does not take part in a chemical reaction to an appreciable extent) is provided to a reaction chamber between pulses of other (e.g., reactant or precursor) gases. For example, a purge may be provided between a precursor pulse and a reactant pulse, thus avoiding or at least reducing gas phase interactions between the precursor and the reactant. It shall be understood that a purge can be effected either in time or in space, or both. For example, in the case of temporal purges, a purge step can be used, e.g., in the temporal sequence of providing a first precursor to a reaction chamber, providing a purge gas to the reaction chamber, and providing a second precursor or reactant to the reaction chamber, wherein the substrate on which a layer is deposited may not move. In the case of spatial purges, a purge step can take the form of moving a substrate from a first location to which a first precursor is supplied, through a purge gas curtain, to a second location to which a second precursor or reactant is supplied.

As used herein, silicon nitride refers to a material that includes silicon and nitrogen. Silicon nitride can be represented by the formula $Si_3N_4$. In some cases, the silicon nitride may not include stoichiometric silicon nitride. In some cases, the silicon nitride can include other elements, such as carbon, hydrogen, or the like. In some cases, silicon nitride consists essentially of silicon and nitrogen or silicon, nitrogen, and hydrogen, As used herein, doped silicon nitride refers to a material that includes a dopant, silicon, and nitrogen. Doped silicon nitride can be represented by the formula SiXN, where X is a dopant. Exemplary dopants include carbon (C) and/or boron (B). Thus, exemplary doped silicon nitrides include SiCN and SiBN. In some cases, the doped silicon nitride can include other elements, such as oxygen, hydrogen, or the like.

Silicon carbon nitride (SiCN) can refer to material that includes silicon, carbon, and nitrogen. As used herein, unless stated otherwise, SiCN is not intended to limit, restrict, or define the bonding or chemical state, for example, the oxidation state of any of Si, C, N, and/or any other element in the film. In some embodiments, SiCN may comprise one or more elements in addition to Si, C, and N, such as H or O. In some embodiments, the SiCN may comprise Si—C bonds and/or Si—N bonds. In some embodiments, the SiCN may comprise Si—H bonds in addition to Si—C and/or Si—N bonds. In some embodiments, the SiCN may comprise from about 0% to about 60% carbon on an atomic basis. In some embodiments, the SiCN may comprise from about 0.1% to about 40%, from about 0.5% to about 30%, from about 1% to about 30%, or from about 5% to about 20% carbon on an atomic basis. In some embodiments, the SiCN may comprise from about 0% to about 70% nitrogen on an atomic basis. In some embodiments, the SiCN may comprise from about 10% to about 70%, from about 15% to about 50%, or from about 20% to about 40% nitrogen on an atomic basis. In some embodiments, the SiCN may comprise about 0% to about 50% silicon on an atomic basis. In some embodiments, the SiCN may comprise from about 10% to about 50%, from about 15% to about 40%, or from about 20% to about 35% silicon on an atomic basis. In some embodiments, the SiCN may comprise from about 0.1% to about 40%, from about 0.5% to about 30%, from about 1% to about 30%, or from about 5% to about 20% hydrogen on an atomic basis. In some embodiments, the SiCN may not comprise oxygen. In some embodiments, the SiCN includes at least one Si—C bond from a precursor, discussed in more detail below.

Silicon boron nitride (SiBN) can refer to material that includes silicon, boron, and nitrogen. As used herein, unless stated otherwise, SiBN is not intended to limit, restrict, or define the bonding or chemical state, for example, the oxidation state of any of Si, B, N, and/or any other element in the film. In some embodiments, SiBN may comprise one or more elements in addition to Si, B, and N, such as H or O. In some embodiments, the SiBN may comprise Si—B bonds and/or Si—N bonds. In some embodiments, the SiBN may comprise Si—H bonds in addition to Si—B and/or Si—N bonds. In some embodiments, the SiBN may comprise from about 0% to about 50% bron on an atomic basis. In some embodiments, the SiBN may comprise from about 0.1% to about 40%, from about 0.5% to about 30%, from about 1% to about 30%, or from about 5% to about 20% boron on an atomic basis. In some embodiments, the SiBN may comprise from about 0% to about 70% nitrogen on an atomic basis. In some embodiments, the SiBN may comprise from about 10% to about 70%, from about 15% to about 50%, or from about 20% to about 40% nitrogen on an atomic basis. In some embodiments, the SiBN may comprise about 0% to about 50% silicon on an atomic basis. In some embodiments, the SiBN may comprise from about 10% to about 50%, from about 15% to about 40%, or from about 20% to about 35% silicon on an atomic basis. In some embodiments, the SiBN may comprise from about 0.1% to about 40%, from about 0.5% to about 30%, from about 1% to about 30%, or from about 5% to about 20% hydrogen on an atomic basis. In some embodiments, the SiBN may not comprise oxygen.

In this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, etc., in some embodiments. Further, in this disclosure, the terms "including," "constituted by" and "having" can refer independently to "typically or broadly comprising," "comprising," "consisting essentially of," or "consisting of" in some embodiments. In accordance with aspects of the disclosure, any defined meanings of terms do not necessarily exclude ordinary and customary meanings of the terms.

Turning now to the figures, FIG. 1 illustrates a method 100 of forming a doped silicon nitride film on a surface of a substrate in accordance with exemplary embodiments described herein. Method 100 includes the steps of using a first thermal cyclic deposition process, forming a layer comprising silicon nitride (102) and using a second thermal cyclic deposition process, forming a layer comprising doped silicon nitride (104). The layer comprising silicon nitride and the layer comprising doped silicon nitride together can form the doped silicon nitride film with desired properties-such as desired dopant concentration or the like. Although not separately illustrated, method 100 can also include a step of pretreating a surface of the substrate. Additionally, although illustrated in a particular sequence, examples of method 100 are not restricted to such order. Further, as discussed below, one or more steps of method 100 can be repeated prior to proceeding to the next step.

Various steps of method 100 can be performed within a single reaction chamber or can be performed in multiple reaction chambers, such as reaction chambers of a cluster tool or process module. In accordance with examples of the disclosure, one or more reaction chambers can form part of a cyclical deposition reactor, such as an atomic layer deposition (ALD) reactor, and particularly a ALD reactor configured for thermal deposition (i.e., a reactor or reaction chamber that does not employ a plasma during steps 102 or 104). A reactor including the reaction chamber can be provided with a heater to activate the reactions by elevating the temperature of one or more of the substrate, the reaction chamber wall, and/or the reactants and/or precursors.

During step 102, the substrate can initially be brought to a desired temperature and pressure for deposition. By way of examples, a temperature (e.g., of a substrate or a substrate support) within a reaction chamber can be less than 750 less than 650° C. or less than 500° C. or less than 450° C. or between about 50° C. and about 550° C., or about 500° C. and about 750° C. or about 300° C. and about 450° C. In some cases, the temperature can be higher—e.g., between about 550° C. and 850° C. or about 580° C. and 750° C. A pressure within the reaction chamber can be about 1 to about 100 Torr. These temperatures and pressures can also be suitable for step 104.

Figure 2:
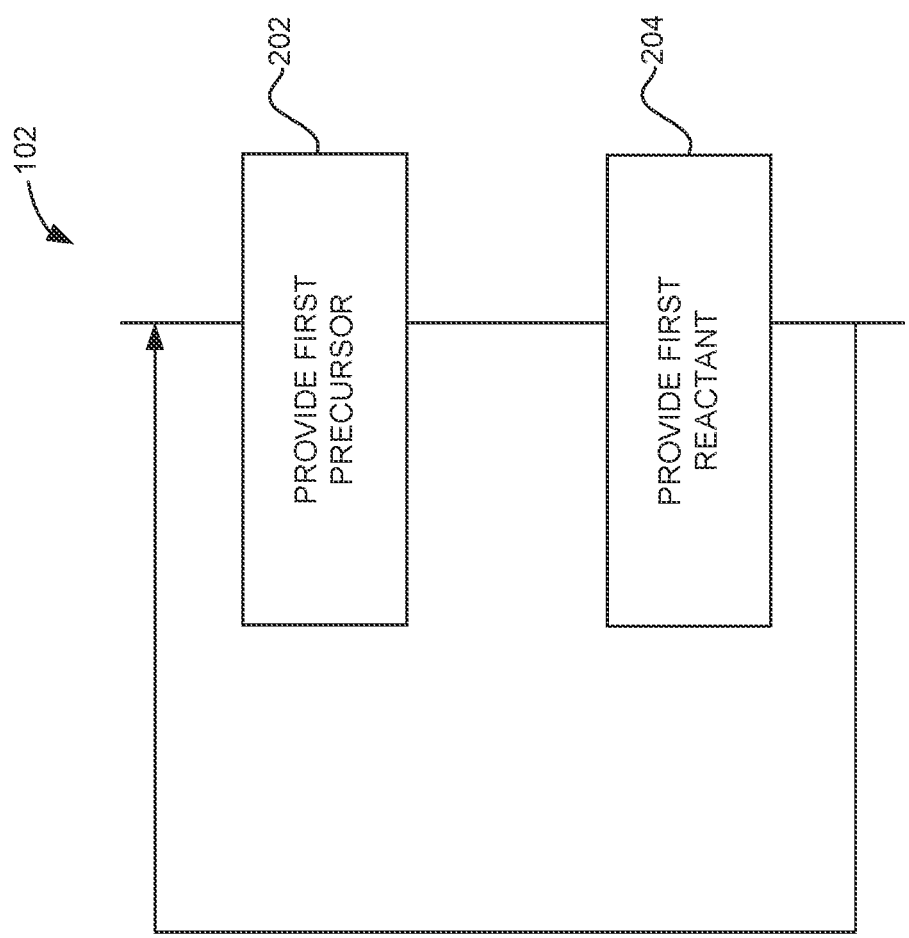
FIGS. 2 and 3 illustrate exemplary steps of the method illustrated in FIG. 1 in greater detail.

FIG. 2 illustrates an exemplary cyclical deposition process suitable for step 102 of method 100. The cyclical deposition process includes a step of providing a first precursor (202)—e.g., for a first precursor pulse—and providing a first reactant to the reaction chamber (204)—e.g., for a first reactant pulse. Step 204 can be optional in some cases. Although not separately illustrated, step 102 can include one or more purges before and/or after steps 202 and 204.

A precursor provided during step 202 can include one or more silicon precursors, such as a halogenated precursor. The halogenated precursor can include silicon and one or more of chlorine (Cl), bromine (Br), and Iodine (I). In some cases, the halogenated precursor includes a halogenated silane compound that can be represented by the formula $H_{2n+2-y}Si_nX_y$, wherein each X is an independently selected halogen, wherein n is between 1 and 5, and wherein y is 1 or more and up to 2n+2. In accordance aspects of these examples, at least one X is chlorine (Cl). By way of particular examples, the first precursor can be selected from the group consisting of monochlorosilane ($SiH_3Cl$), dichlorosilane ($SiH_2Cl_2$), trichlorosilane ($HCl_3Si$), hexachlorodisilane (($SiCl_3)_2$), octachlorotrisilane ($Cl_8Si_3$), silicon tetrachloride ($SiCl_4$), dimethyldichlorosilane ($SiCl_2Me_2$), tetrachloro silane ($SiCl_4$), tetraiodo silane ($SiI_4$), triiodo silane ($SiI_3H$), deiodo silane($SiI_2H_2$), Si bromamide-based precursors. In some case, the first precursor does not include a dopant, such as carbon (C) or boron (B).

A duration of a first precursor pulse during step 202 can be about 0.01 to about 5 or about 5 to about 60 seconds. A flowrate of the first precursor during precursor step 202 can be about 50 to about 500 or about 500 to about 3000 sccm.

During step 204, a first reactant is provided to the reaction chamber. The first reactant can include a compound comprising nitrogen. In some cases, the first reactant comprises a compound comprising hydrogen. Exemplary compounds suitable for use as the first reactant can be selected from one or more of $H_2$ and $N_2$ (e.g., a mixture including 0 to 95 v % $H_2$ and/or 100 to about 5 v % $N_2$), $NH_3$, $N_2H_4$, or an alkyl hydrazine represented by the following formula, where each of R1-R4 can be independently selected from a C1-C4 alkyl group or H. In some cases, the first reactant does not include a dopant, such as carbon and/or boron.

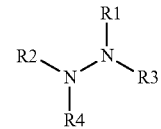

A duration of a first reactant pulse during step 204 can be about 0.02 to about 200 seconds. A flowrate of the first reactant during step 204 can be about 1 to about 500 sccm.

Figure 3:
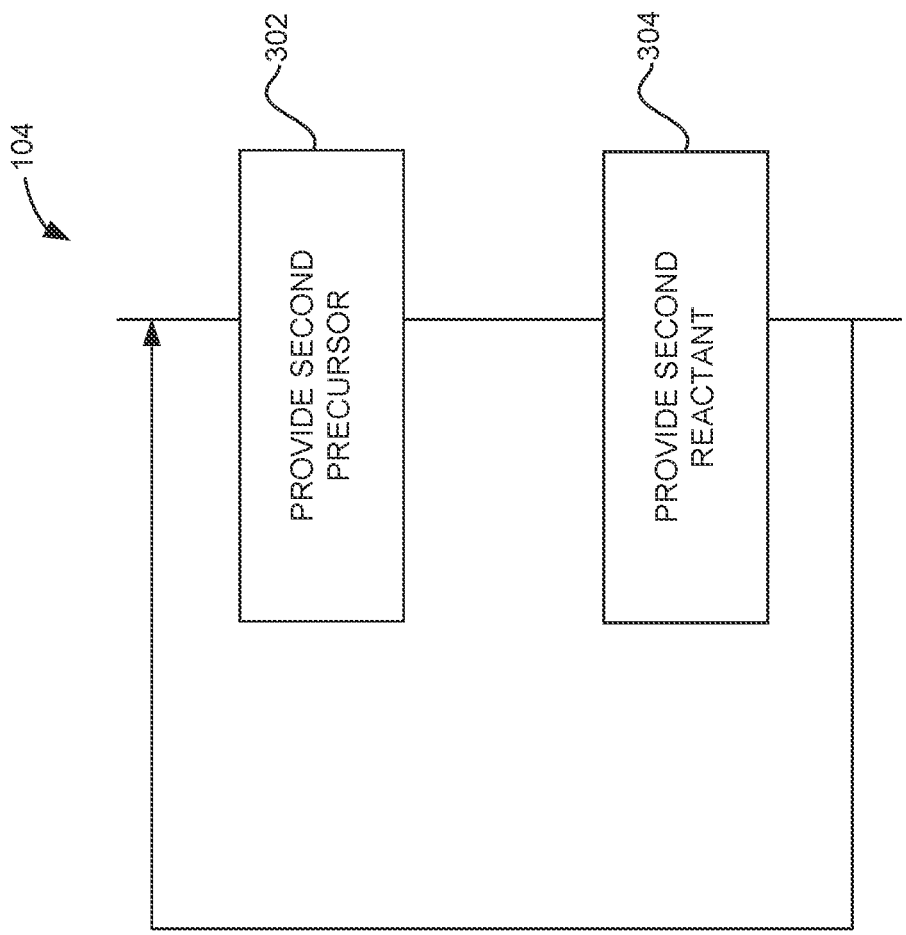

Referring again to FIG. 1, a process suitable for step 104 is illustrated in FIG. 3. As illustrated, step 104 can include a cyclical process that includes a step of providing a second precursor (302) and a step of providing a second reactant (304). Similar to step 102, discussed above, step 304 may be optional in some cases. Further, step 104 can include one or more purges before and/or after steps 302 and 304.

A second precursor provided during step 302 can include a dopant. For example, the second precursor comprises one or more of carbon (C) and boron (B). In some cases, the second precursor can (e.g., additionally) include nitrogen (N). In some cases, the second precursor differs from the first precursor. In some cases, such as when the first and second reactants differ, the first precursor and the second precursor can be the same and/or include the same compound.

Exemplary carbon-containing compounds suitable for use as the second precursor include silylamines, and aminosilanes. In some cases, the second precursor comprises a silicon-carbon bond. By way of particular examples, the carbon-containing second precursor can be or include one or more of tetramethyl bis(2,2-dimethylhydrazino)disilane), diisopropylaminosilane ($H_3Si(N(i-Pr)_2$)), bis(tertiary-butylamino)silane (($C_4H_9(H)N)_2SiH_2$), tetrakis(ethylamino)silane ($Si(NHEt)_4$), tetrakis(dimethylamino)silane ($Si(NMe_2)_4$), tetrakis(ethylmethylamino)silane ($Si(NEtMe)_4$), tetrakis(diethylamino)silane (Si(NEt$_2$))$_4$), tris(dimethylamino)silane (HSi(NMe$_2$)$_3$), tris(ethylmethylamino)silane (HSi(NEtMe)$_3$), tris(diethylamino)silane (HSi(NEt$_2$)$_3$), tris(dimethylhydrazino)silane (HSi(N(H)NMe$_2$)$_3$), bis(diethylamino)silane (H$_2$Si(NEt$_2$)$_2$), bis(diisopropylamino) silane (H$_2$Si(N(i-Pr)$_2$)$_2$), tris(isopropylamino)silane (HSi(N(i-Pr)$_2$)$_3$), (diisopropylamino)silane (H$_3$SiN(i-Pr)$_2$), trisilylamine ((SiH$_3$)$_3$N, TSA), disiloxane (DSO), disilylmethylamine ((SiH$_3$)$_2$NMe, DSMA), disilylethylamine ((SiH$_3$)$_2$NEt, DSEA), disilylisopropylamine ((SiH$_3$)$_2$N(i-Pr), DSIPA), disilyl-tert-butylamine ((SiH$_3$)$_2$N(tBu), DSTBA), diethylsilylamine (SiH$_3$NEt$_2$, DESA), di-tert-butylsilylamine (SiH$_3$N(tBu)$_2$, DTBSA), bis(diethylamino)silane (SiH$_2$(NEt$_2$)$_2$, BDEAS), bis(dimethylamino)silane (SiH$_2$(NMe$_2$)$_2$, BDMAS), bis(ethylmethylamino)silane (SiH$_2$[N(Et)(Me)]$_2$, BEMAS), bis(tert-butylamino)silane (SiH$_2$(NHtBu)$_2$, BTBAS), diisopropylsilylamine (SiH$_3$N(i-Pr)$_2$, DIPSA), hexakis(ethylamino)disilane (Si$_2$(NHEt)$_6$), bis(trimethylsilylamino)silane (SiH$_2$(NHSiMe$_3$)$_2$, BITS), and 1,2-Bis(dimethylamino) tetramethyl disilane ((CH$_3$)$_2$[(CH$_3$)$_2$N]Si—Si[(CH$_3$)$_2$N](CH$_3$)$_2$), where Me represents a methyl group, Et represents an ethyl group, tBu represents a tert-butyl group, and i-Pr represents an isopropyl group. As noted above, in the case of SiCN, the deposited SiCN can include at least one Si—C bond from the (e.g., second) precursor.

In the case of boron doped silicon nitride films, the second precursor can be or include one or more boron halogen compounds, such as of boron trichloride (BCl$_3$), B$_2$H$_6$, BBr$_3$, BI$_3$, B$_3$H$_{12}$. In some cases, the BCl$_3$ can be provided with another reactant, such as a nitrogen-containing compound—e.g., a nitrogen-containing compound described herein.

During step 304, the second reactant is provided to the reaction chamber. The second reactant can be or include any of the compounds noted above in connection with the first reactant. In some cases, the second reactant can be the same as or include the same compound as the first reactant. By way of particular example, the first and second reactant can include ammonia (NH$_3$). Or, in cases in which the second reactant provides a dopant, the second reactant can include carbon, such as a methylamine group, which can serve as a (carbon) dopant source. Exemplary methylamine reactants include trimethylamine (CH$_3$)$_3$N, methylamine (CH$_3$NH$_2$), and the like. Additional carbon reactants, which can be used along with or co-flowed to the reactor with a nitrogen-containing reactant include C$_1$-C$_4$ hydrocarbons, such as, for example C$_2$H$_4$ and/or C$_2$H$_2$. The methylamine reactants are basic and may react with acidic precursors, such as the halogenated silane compound noted above at desirable temperatures.

A duration of a second reactant pulse during step 304 can be about 0.02 to about 200 seconds. A flowrate of the second reactant during step 304 can be about 1 to about 500 sccm.

In accordance with examples of the disclosure, one or more of the first precursor differs from the second precursor and the first reactant differs from the second reactant. A reactant and/or a precursor can provide a dopant to form the layer comprising doped silicon nitride (step 104). In accordance with examples of the disclosure, such precursor or reactant may not be used to for the layer comprising silicon nitride (step 102).

As noted above, method 100 can include a step of pretreating a surface of the substrate prior to step 102. The pretreating can be performed in the same reaction chamber as step 102 or in a plasma apparatus (e.g., within the same reactor, module, or reactor system).

The step of pretreating can include forming activated species from a nitrogen-containing gas, such as NH$_3$, N$_2$H$_4$, or other nitrogen and/or hydrogen-containing gas or compound described herein. The step of pretreating can produce reaction sites on the substrate surface for the first precursor provided during step 102. When used, the activated species can be formed using, for example, a direct, indirect, or remote plasma.

A flowrate of the nitrogen-containing gas during step of pretreating can be about 10 to about 100 or about 100 to about 3000 sccm. A duration of the step of step of pretreating can be about 1 to about 900 seconds.

Various steps of method 100 can be repeated prior to proceeding to the next step. For example, step 102 can be repeated one or more times prior to proceeding to step 104. Likewise, step 104 can be repeated one or more times prior to step 102. Further one or more of steps 202, 204, 302, and 304 can be repeated prior to proceeding to the next step of method 100. By varying a number of cycles or steps, a dopant (e.g., carbon and/or boron) concentration can be manipulated or controlled. For example, a doped silicon nitride film including layer(s) comprising silicon nitride formed during step 102 and the layer(s) comprising doped silicon nitride formed during step 104 can have a dopant concentration that is between 0 or greater than 0 and 54 at % or between 0 or greater than 0 to 30 at %.

Figure 4:
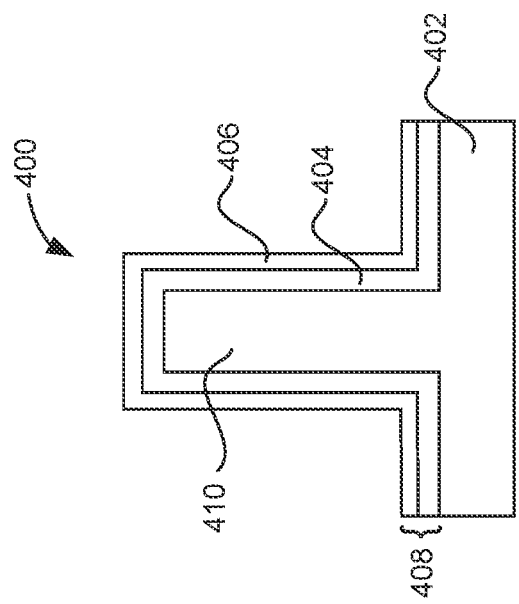
FIG. 4 illustrates a structure in accordance with examples of the disclosure.

FIG. 4 illustrates a structure 400 formed in accordance with examples of the disclosure. Structure 400 includes a substrate 402, a layer comprising silicon nitride 404, a layer comprising doped silicon nitride 406, and a doped silicon nitride film 408.

Substrate 402 can include any substrate described herein. Substrate 402 can include a feature 410. Feature 410 can have an aspect ratio of, for example, 0 to 200:1. In some cases, substrate 402 can include a (e.g., metal or metalloid) oxide or nitride surface. In some cases, substrate 402 can include a metal (e.g., transition metal, such as tungsten) surface.

Layer comprising silicon nitride 404 can be formed according to step 102 of method 100. A thickness of layer comprising silicon nitride 404 can range from, for example, about 0.1 to about 100 nm.

Layer comprising doped silicon nitride 406 can be formed according to step 104 of method 100. In accordance with examples of the disclosure, the doped silicon nitride layer comprises a silicon-carbon bond from the second precursor, such that the doped silicon nitride film comprises the silicon-carbon bond from the second precursor. A thickness of layer comprising doped silicon nitride 406 can range from, for example, about greater than 0 to about 100 nm.

One or more layers comprising silicon nitride 404 and one or more layers comprising doped silicon nitride 406 together can form the doped silicon nitride film 408.

Structures in accordance with the disclosure can include multiple layers comprising silicon nitride 404 and multiple layers comprising doped silicon nitride 406, which can form a laminate overlying substrate 402, including feature 410. As noted above, advantages of forming a doped silicon nitride film using one or more layers comprising silicon nitride 404 and one or more layers comprising doped silicon nitride 406 to form doped silicon nitride film 408 allows use of thermal deposition processes to form conformal doped silicon nitride film 408 with a desired dopant concentration, such as a dopant concentration noted herein.

In some cases, the doped silicon nitride film can include oxygen. For example, the doped silicon nitride film can include 0 or greater than 0 to about 60 at % oxygen.

Additionally or alternatively, the doped silicon nitride film can include hydrogen. For example, the doped silicon nitride film can include 0 or greater than 0 to about 30 at % hydrogen.

Doped silicon nitride films 408 as described herein can exhibit various desirable properties, such as a dielectric constant less than a dielectric constant of $Si_3N_4$, or less than 5, 3 or 2 or between 1 and 5 or between 1.5 and 4.8. Additionally or alternatively, a density of the of the doped silicon nitride film 408 can be greater than 2 g/cm$^3$ or range from about 3.2 g/cm$^3$ and can vary by less than 10%, 5%, 2%, or 1% over feature having as aspect ratio of 10:1 or more. Additionally/or alternatively, a wet etch rate of the doped silicon nitride film in 100:1 dilute phosphoric acid can be negligible (e.g., less than 1 Angstrom after one hour).

A (e.g., thickness and/or composition) non-uniformity of doped silicon nitride films formed according to methods described herein can be less than 2 or less than 1.5 percent.

Additionally or alternatively, a density or wet etch rate of the doped silicon nitride film 408 over a feature having as aspect ratio of 10:1 or more can vary by less than 10%, 5%, 2%, or 1%. Additionally or alternatively, a thickness of the doped silicon nitride film 408 over a feature having as aspect ratio of 10:1 or more can vary by less than 10%, 5%, 2%, or 1%.

SPECIFIC EXAMPLES

The examples below are meant to be illustrative of embodiments of the disclosure and are not meant to be exhaustive or limiting.

Example 1

First precursor halogenated silane (e.g., hexachlorodisilane (($SiCl_3)_2$,), first reactant does not include a dopant (e.g., ammonia ($NH_3$)), second precursor comprises a dopant (e.g., 1,2-bis(dimethylamino) tetramethyl disilane (($CH_3)_2$[($CH_3)_2$N]Si—Si[($CH_3)_2$N]($CH_3)_2$)), second reactant can be the same as first reactant—e.g., ammonia ($NH_3$). Hexachlorodisilane can mitigate nucleation delay issues on, for example metal, such as tungsten, compared to nucleation delays that would result from using only the second precursor. Temperature can be about 400-500° C. and pressure can be about 1-10 Torr.

Example 2

First precursor comprises a halogenated silane (e.g., hexachlorodisilane (($SiCl_3)_2$) and/or octachlorotrisilane ($Cl_8Si_3$)) (acidic), first reactant comprises a basic compound (e.g., $NH_3$, $N_2H_4$), second precursor can be same or different from first precursor, second reactant comprises a dopant, such as a carbon dopant, such as methylamine reactant. A temperature (e.g., of a substrate or a substrate support) within a reaction chamber can be less than 750 less than 650° C. or less than 500° C. or less than 450° C. or between about 50° C. and about 550° C., or about 500° C. and about 750° C. or about 300° C. and about 450° C. In some cases, the temperature can be higher—e.g., between about 550° C. and 850° C. or about 580° C. and 750° C. A pressure within the reaction chamber can be about 1 to about 100 Torr.

Figure 5:
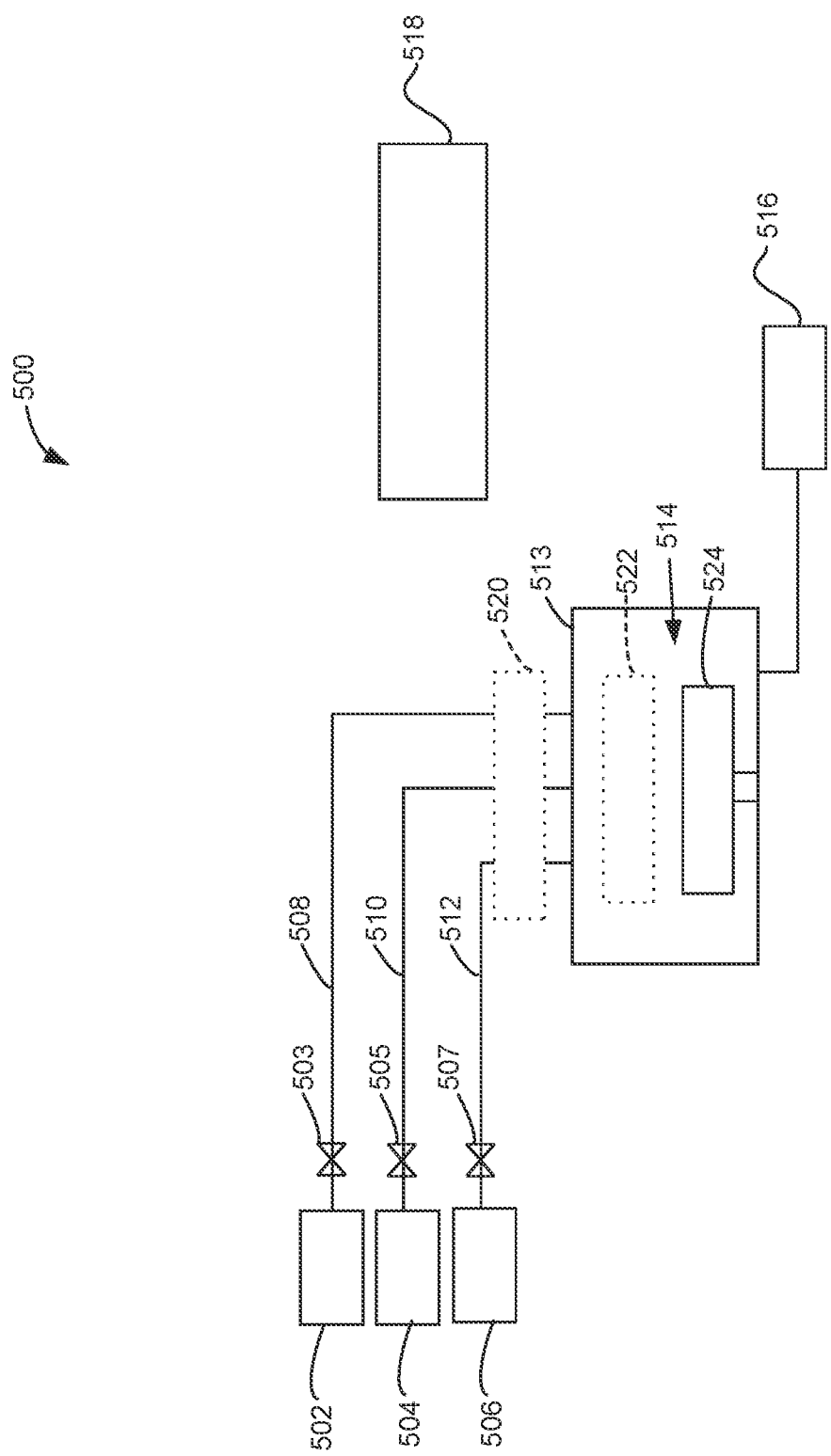
FIG. 5 illustrates a system in accordance with yet further examples of the disclosure.

FIG. 5 illustrates a system 500 in accordance with yet additional exemplary embodiments of the disclosure. System 500 can be used to perform a method as described herein and/or form a structure as described herein.

In the illustrated example, system 500 includes one or more reactors 513—each including one or more reaction chambers 514—a first precursor source 502 in fluid communication via a first valve 503 with one or more reaction chambers 514, a reactant source 504 in fluid communication via a second valve 505 with one or more reaction chambers 514, a second precursor source 506 in fluid communication via a third valve 507 with one or more reaction chambers 514, an exhaust source 516, and a controller 518. System 500 can optionally include a remote plasma source 520 to excite a gas (e.g., during a treatment step) from one or more sources 502-506 or another gas source.

Reaction chamber 514 can include any suitable reaction chamber, such as an ALD or chemical vapor deposition (CVD) reaction chamber. Reaction chamber 514 can include a gas distribution system 522, such as a showerhead, and a susceptor 524 to retain a substrate.

First precursor source 502 can include a vessel and one or more first precursors as described herein—alone or mixed with one or more carrier (e.g., inert) gases. Reactant source 504 can include a vessel and one or more reactants as described herein—alone or mixed with one or more carrier gases. Third gas source 506 can include one or more second precursors as described herein. Although illustrated with three gas sources 502-506, system 500 can include any suitable number of gas sources. Gas sources 502-506 can be coupled to reaction chamber 514 via lines 508-512, which can each include flow controllers, valves, heaters, and the like.

Exhaust source 516 can include one or more vacuum pumps to remove gas from the reaction chamber 514.

Controller 518 can include electronic circuitry and software to selectively operate valves, manifolds, heaters, pumps and other components included in system 500. Such circuitry and components can operate to introduce precursors, reactants, and purge gases from the respective sources 502-506. Controller 518 can control timing of gas pulse sequences, temperature of the substrate and/or reaction chamber, pressure within the reaction chamber, and various other operations to provide proper operation of system 500. Controller 518 can include control software to electrically or pneumatically control valves to control flow of precursors, reactants and purge gases into and out of the one or more reaction chambers 514. Controller 518 can include modules, such as a software or hardware component, e.g., a FPGA or ASIC, which perform certain tasks. A module can advantageously be configured to reside on the addressable storage medium of the control system and be configured to execute one or more processes. By way of example, controller 518 can be operably connected to first valve 503 and second valve 505 and third valve 507 and configured and programmed to form a layer comprising silicon nitride and form a layer comprising doped silicon nitride to form a doped silicon nitride film, as described herein.

Other configurations of system 500 are possible, including different numbers and kinds of precursor and reactant sources and purge gas sources. Further, it will be appreciated that there are many arrangements of valves, conduits, precursor sources, and purge gas sources that may be used to accomplish the goal of selectively feeding gases into reaction chamber 514. Further, as a schematic representation of an apparatus, many components have been omitted for simplicity of illustration; such components may include, for example, various valves, manifolds, purifiers, heaters, containers, vents, and/or bypasses.

During operation of system 500, substrates are transferred from, e.g., a substrate handling system (not shown) to reaction chamber 514. Once substrate(s) are transferred to reaction chamber 514, one or more gases from gas sources 502-506, such as precursors, reactants, carrier gases, and/or purge gases, are introduced into reaction chamber 514 to form the doped silicon nitride film The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

The invention claimed is:

1. A method of forming a conformal doped silicon nitride film on a surface of a substrate, the method comprising the steps of:
using a first thermal atomic layer deposition process to deposit a silicon nitride layer; and
using a second thermal atomic layer deposition process to deposit a doped silicon nitride layer,
wherein the first thermal atomic layer deposition process comprises providing a first precursor and a first reactant to a reaction chamber,
wherein the second thermal atomic layer deposition process comprises providing a second precursor and a second reactant to the reaction chamber, wherein the second reactant comprises a dopant,
wherein one or more of the first precursor differs from the second precursor and the first reactant differs from the second reactant,
wherein the silicon nitride layer and the doped silicon nitride layer together form the conformal doped silicon nitride film,
wherein the second precursor comprises one or more of carbon (C) and boron (B),
wherein the dopant comprises carbon (C) or boron (B) and a concentration of the dopant in the conformal doped silicon nitride film is between 0 and 30 at %,
wherein the conformal doped silicon nitride film exhibits a step coverage equal to or greater than 50%,
wherein a temperature within the reaction chamber is less than 650° C., and
wherein the conformal doped silicon nitride film is not exposed to a plasma during the method.

2. The method of claim 1, wherein the first precursor comprises a halogenated precursor comprising Iodine (I).

3. The method of claim 1, wherein the second precursor comprises boron (B).

4. The method of claim 1, wherein the first precursor comprises a compound represented by: $H_{2n+2-y}Si_nX_y$, wherein each X is an independently selected halogen, wherein n is between 1 and 5, and wherein y is 1 or more and up to 2n+2.

5. The method of claim 1, wherein the conformal doped silicon nitride film does not comprise oxygen.

6. The method of claim 1, wherein the first precursor is selected from the group consisting of monochlorosilane ($SiH_3Cl$), dichlorosilane ($SiH_2Cl_2$), trichlorosilane ($HCl_3Si$), hexachlorodisilane (($SiCl_3)_2$), octachlorotrisilane ($Cl_8Si_3$), silicon tetrachloride ($SiCl_4$), dimethyldichlorosilane ($SiCl_2Me_2$), tetraiodo silane ($SiI_4$), triiodo silane ($SiI_3H$), and diiodo silane ($SiI_2H_2$).

7. The method of claim 1, wherein the second precursor comprises one or more of bis(diisopropylamino)silane ($H_2Si(N(i-Pr)_2)_2$), tris(isopropylamino)silane ($HSi(N(i-Pr)_2)_3$), (diisopropylamino)silane ($H_3SiN(i-Pr)_2$), disiloxane (DSO), disilylmethylamine (($SiH_3)_2NMe$, DSMA), disilylethylamine (($SiH_3)_2NEt$, DSEA), disilylisopropylamine (($SiH_3)_2N(i-Pr)$, DSIPA), disilyl-tert-butylamine (($SiH_3)_2N(tBu)$, DSTBA), diethylsilylamine ($SiH_3NEt_2$, DESA), di-tert-butylsilylamine ($Si_3N(ttBu)_2$, DTBSA), bis(diethylamino)silane ($SiH_2(NEt_2)_2$, BDEAS), bis(dimethylamino)silane ($SiH_2(NMe_2)_2$, BDMAS), bis(ethylmethylamino)silane ($SiH_2[N(Et)(Me)]_2$, BEMAS), bis(tert-butylamino)silane ($SiH_2(NHtBu)_2$, BTBAS), diisopropylsilylamine ($SiH_3N(i-Pr)_2$, DIPSA), hexakis(ethylamino)disilane ($Si_2(NHEt)_6$), bis(trimethylsilylamino)silane ($SiH_2(NHSiMe_3)_2$, BITS), and 1,2-Bis(dimethylamino) tetramethyl disilane (($CH_3)_2[(CH_3)_2N]Si—Si[(CH_3)_2N](CH_3)_2$), where Me represents a methyl group, Et represents an ethyl group, tBu represents a tert-butyl group, and i-Pr represents an isopropyl group.

8. The method of claim 1, wherein the second precursor comprises one or more of tetramethyl bis(2,2-dimethylhydrazino)disilane, diisopropylaminosilane ($H_3Si(N(i-Pr)_2)$), bis(tertiary-butylamino)silane (($C_4H_9(H)N)_2SiH_2$), tetrakis(ethylamino)silane ($Si(NHEt)_4$), tetrakis(dimethylamino)silane ($Si(NMe_2)_4$), tetrakis(ethylmethylamino)silane ($Si(NEtMe)_4$), tetrakis(diethylamino)silane ($Si(NEt_2))_4$), tris(dimethylamino)silane ($HSi(NMe_2)_3$), tris(ethylmethylamino)silane ($HSi(NEtMe)_3$), tris(diethylamino)silane ($HSi(NEt_2)_3$), tris(dimethylhydrazino)silane ($HSi(N(H)NMe_2)_3$), bis(diethylamino)silane ($H_2Si(NEt_2)_2$), where Me represents a methyl group, Et represents an ethyl group, tBu represents a tert-butyl group, and i-Pr represents an isopropyl group.

9. The method of claim 1, wherein the first reactant is selected from one or more of $H_2$ and $N_2$, $NH_3$, $N_2H_4$, or an alkyl hydrazine represented by formula (i), where each of R1-R4 can be independently selected from a $C_1$-$C_4$ alkyl group or H

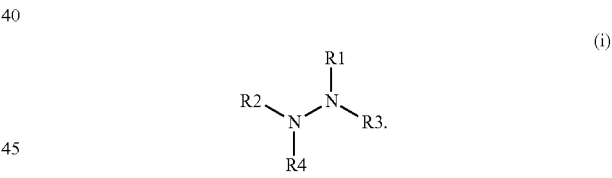

10. The method of claim 1, wherein the first reactant and the second reactant comprise the same compound.

11. The method of claim 1, wherein the second precursor comprises a silicon-carbon bond, and wherein the second precursor further comprises nitrogen.

12. The method of claim 1, wherein the doped silicon nitride layer is deposited on the silicon nitride layer.

13. The method of claim 1, wherein the second precursor comprises a boron halogen compound.

14. The method of claim 1, wherein the second precursor comprises one or more of tetramethyl bis(2,2-dimethylhydrazino)disilane, diisopropylaminosilane ($H_3Si(N(i-Pr)_2)$), bis(tertiary-butylamino)silane (($C_4H_9(H)N)_2SiH_2$), tetrakis(ethylamino)silane ($Si(NHEt)_4$), tetrakis(dimethylamino)silane ($Si(NMe_2)_4$), tetrakis(ethylmethylamino)silane ($Si(NEtMe)_4$), tetrakis(diethylamino)silane ($Si(NEt_2))_4$), tris(dimethylamino)silane ($HSi(NMe_2)_3$), tris(ethylmethylamino)silane ($HSi(NEtMe)_3$), tris(diethylamino)silane ($HSi(NEt_2)_3$), tris(dimethylhydrazino)silane ($HSi(N(H)NMe_2)_3$), bis(diethylamino)silane ($H_2Si$ (NEt$_2$)$_2$), bis(diisopropylamino)silane (H$_2$Si(N(i-Pr)$_2$)$_2$), tris(isopropylamino)silane (HSi(N(i-Pr)$_2$)$_3$), (diisopropylamino)silane (H$_3$SiN(i-Pr)$_2$), disiloxane (DSO), disilylmethylamine ((SiH$_3$)$_2$NMe, DSMA), disilylethylamine ((SiH$_3$)$_2$NEt, DSEA), disilylisopropylamine ((SiH$_3$)$_2$N(i-Pr), DSIPA), disilyl-tert-butylamine ((SiH$_3$)$_2$N(tBu), DSTBA), diethylsilylamine (SiH$_3$NEt$_2$, DESA), di-tert-butylsilylamine (SiH$_3$N(tBu)$_2$, DTBSA), bis(diethylamino)silane (SiH$_2$(NEt$_2$)$_2$, BDEAS), bis(dimethylamino)silane (SiH$_2$(NMe$_2$)$_2$, BDMAS), bis(ethylmethylamino)silane (SiH$_2$[N(Et)(Me)]$_2$, BEMAS), bis(tert-butylamino)silane (SiH$_2$(NHtBu)$_2$, BTBAS), diisopropylsilylamine (SiH$_3$N(i-Pr)$_2$, DIPSA), hexakis(ethylamino)disilane (Si$_2$(NHEt)$_6$), bis(trimethylsilylamino)silane (SiH$_2$(NHSiMe$_3$)$_2$, BITS), and 1,2-Bis(dimethylamino) tetramethyl disilane ((CH$_3$)$_2$[(CH$_3$)$_2$N]Si—Si[(CH$_3$)$_2$N](CH$_3$)$_2$), where Me represents a methyl group, Et represents an ethyl group, tBu represents a tert-butyl group, and i-Pr represents an isopropyl group.

15. The method of claim 1, further comprising a step of pretreating a surface of the substrate, wherein the step of pretreating comprises forming activated species from a nitrogen-containing gas.

16. The method of claim 1, wherein a carbon concentration in the conformal doped silicon nitride film is manipulated by adjusting a number of cycles of the first thermal cyclic deposition process relative to a number of cycles of the second thermal cyclic deposition process.

17. The method of claim 1, wherein the surface of a substrate comprises a transition metal comprising tungsten (W).

18. The method of claim 1, wherein the conformal doped silicon nitride film exhibits a dielectric constant between 1.5 and 4.8.

19. The method of claim 1, wherein a temperature within the reaction chamber is less than 500° C.

20. The method of claim 1, wherein a temperature within the reaction chamber is less than 450° C.

21. The method of claim 1, wherein the surface of the substrate includes structures having aspect ratios of more than 5.

* * * * *